United States Patent
Sato et al.

(10) Patent No.: US 9,758,873 B2
(45) Date of Patent: Sep. 12, 2017

(54) MANUFACTURING METHOD FOR MAGNETIC RECORDING MEDIUM

(71) Applicant: FUJI ELECTRIC CO., LTD., Kawasaki-shi (JP)

(72) Inventors: Narumi Sato, Matsumoto (JP); Akiyasu Kumagai, Matsumoto (JP); Tomonori Katano, Matsumoto (JP); Katsumi Taniguchi, Matsumoto (JP); Hiromi Ono, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/487,079

(22) Filed: Sep. 15, 2014

(65) Prior Publication Data

US 2015/0004328 A1    Jan. 1, 2015

Related U.S. Application Data

(63) Continuation of application No. PCT/JP2013/003952, filed on Jun. 25, 2013.

(30) Foreign Application Priority Data

Sep. 14, 2012    (JP) ................. 2012-202233

(51) Int. Cl.
*B05D 3/06* (2006.01)
*C23C 16/56* (2006.01)
(Continued)

(52) U.S. Cl.
CPC .............. *C23C 16/56* (2013.01); *C23C 16/02* (2013.01); *C23C 16/0272* (2013.01);
(Continued)

(58) Field of Classification Search
CPC ......... G11B 5/8408; G11B 5/72; C23C 16/02; C23C 16/26; C23C 16/27; C23C 16/271;
(Continued)

(56) References Cited

U.S. PATENT DOCUMENTS

| 5,554,418 A | 9/1996 | Ito et al. |
| 5,871,841 A | 2/1999 | Kuratomi |

(Continued)

FOREIGN PATENT DOCUMENTS

| CN | 101303860 A | 11/2008 |
| CN | 101866655 A | 10/2010 |

(Continued)

OTHER PUBLICATIONS

John Robertson, "The deposition mechanism of diamond-like-a-C and a-C:H", Diamond and Related Materials, vol. 3, No. 4-6, Apr. 1994, p. 361-368.

(Continued)

*Primary Examiner* — Marianne L Padgett
(74) *Attorney, Agent, or Firm* — Rabin & Berdo, P.C.

(57) ABSTRACT

A manufacturing method for a magnetic recording medium which includes a magnetic layer, a lower protective layer, an upper protective layer and a lubricating layer on a substrate, and in which the total film thickness of the lower protective layer and the upper protective layer is 2.5 nm or less, includes: 1) depositing the lower protective layer; 2) performing oxygen plasma treatment on the lower protective layer; 3) depositing the upper protective layer; and 4) performing nitrogen plasma treatment on the upper protective layer. It is preferable that the lower protective layer and the upper protective layer are formed of a carbon-based material, and it is further more preferable that the lower protective layer and the upper protective layer are formed of diamond-like carbon. Moreover, it is preferable that the (Continued)

contact angle of the lower protective layer with respect to water in the atmosphere is 25° or less.

5 Claims, 2 Drawing Sheets

(51) Int. Cl.
| | |
|---|---|
| *C23C 16/02* | (2006.01) |
| *C23C 16/26* | (2006.01) |
| *C23C 16/36* | (2006.01) |
| *G11B 5/72* | (2006.01) |
| *G11B 5/84* | (2006.01) |

(52) U.S. Cl.
CPC .............. *C23C 16/26* (2013.01); *C23C 16/36* (2013.01); *G11B 5/72* (2013.01); *G11B 5/8408* (2013.01); *C23C 16/029* (2013.01)

(58) Field of Classification Search
CPC ..... C23C 16/272; C23C 16/273; C23C 16/36; C23C 16/56
USPC ........ 427/535, 539, 530, 577, 129, 130, 131
See application file for complete search history.

(56) References Cited

U.S. PATENT DOCUMENTS

| | | | | |
|---|---|---|---|---|
| 7,782,569 | B2* | 8/2010 | Cheng | C23C 14/024 360/122 |
| 8,492,011 | B2* | 7/2013 | Itoh | G11B 5/8408 427/131 |
| 9,177,587 | B2* | 11/2015 | Okabe | G11B 5/8408 |
| 9,196,282 | B2* | 11/2015 | Sato | G11B 5/72 |
| 9,478,243 | B2* | 10/2016 | Sato | G11B 5/72 |
| 9,646,643 | B2* | 5/2017 | Ota | G11B 5/8408 |
| 2001/0031382 | A1 | 10/2001 | Kusakawa et al. | |
| 2002/0064606 | A1* | 5/2002 | Sakaguchi | C23C 16/26 427/569 |
| 2006/0257694 | A1* | 11/2006 | Hieda | G11B 5/855 428/826 |
| 2008/0044688 | A1* | 2/2008 | Li | G11B 5/732 428/831 |
| 2008/0187781 | A1 | 8/2008 | Cheng et al. | |
| 2009/0181264 | A1* | 7/2009 | Taniguchi | G11B 5/855 428/831 |
| 2010/0103559 | A1* | 4/2010 | Sato | B82Y 10/00 360/135 |
| 2010/0116645 | A1* | 5/2010 | Sato | G11B 5/8404 204/192.13 |
| 2010/0167090 | A1* | 7/2010 | Nagata | G11B 5/8408 428/826 |
| 2010/0246064 | A1 | 9/2010 | Itoh et al. | |
| 2011/0163291 | A1* | 7/2011 | Scarsbrook | G06N 99/002 257/9 |
| 2013/0034747 | A1* | 2/2013 | Taniguchi | G11B 5/653 428/835.1 |
| 2013/0040168 | A1* | 2/2013 | Sato | G11B 5/8408 428/846 |
| 2013/0220152 | A1* | 8/2013 | Shibusawa | B41N 1/248 101/127 |
| 2015/0332724 | A1* | 11/2015 | Okabe | G11B 5/85 427/130 |
| 2017/0022607 | A1* | 1/2017 | Shibusawa | H01M 2/0242 |

FOREIGN PATENT DOCUMENTS

| | | |
|---|---|---|
| JP | S61-222024 A | 10/1986 |
| JP | H07-187644 A | 7/1995 |
| JP | H08-167138 A | 6/1996 |
| JP | H08-180363 A | 7/1996 |
| JP | H09-138943 A | 5/1997 |
| JP | H09-237415 A | 9/1997 |
| JP | 2001-266328 A | 9/2001 |
| JP | 2008-090919 A | 4/2008 |
| JP | 2008-090919 A | 4/2008 |
| JP | 2008-192288 A | 8/2008 |
| JP | 2010-238359 A | 10/2010 |

OTHER PUBLICATIONS

Chinese Office Action with translation dated Feb. 27, 2015.

* cited by examiner

FIG. 1

MANUFACTURING METHOD FOR MAGNETIC RECORDING MEDIUM

This application is a continuation under 35 U.S.C. 120 of International Application PCT/JP2013/003952 having the International Filing Date of Jun. 25, 2013, and having the benefit of the earlier filing date of Japanese Application No. 2012-202233, filed Sep. 14, 2012. All of the identified applications are fully incorporated herein by reference.

TECHNICAL FIELD

The present invention relates to a manufacturing method for a magnetic recording medium that is used for an information recording device of an information processing apparatus, such as a computer, or a recording device included in a consumer appliance, and more particularly to a manufacturing method for a magnetic recording medium used for a hard disk device.

BACKGROUND ART

Recording capacities of a hard disk drive are constantly increasing, and recording densities of a magnetic recording medium included therein are also continuously increasing. In a conventional longitudinal magnetic recording method, thermal fluctuation has become a major problem to increase recording densities, and technical innovations, to commercialize perpendicular magnetic recording type magnetic medium, which are new recording methods to solve the above problem, have just recently become available. Recording densities are increasing nonstop at an annual rate of about 50%. This is due to the constant advancements in all kinds of technical fields, not just due to the above mentioned shift in recording methods. For example, concerning HDI (Head Disk Interface) technology, the flying height of a magnetic head is decreasing every year, and a further decrease in the distance between a magnetic layer of a magnetic recording medium and a magnetic head (magnetic spacing) is demanded. As one means of decreasing the magnetic spacing, decreasing the thickness of a protective layer formed on the magnetic layer, and that of a lubricating layer, is demanded.

The protective layer plays a role of protecting the magnetic layer and must have high corrosion resistance so that the magnetic layer, of which major component is a metal material, does not corrode by reacting with moisture in the air or with corrosive gas. Additionally the protective layer must be durable against the running of a magnetic head. This is to prevent damage of the magnetic layer when the magnetic head, which is flying above the magnetic recording medium at a relatively high-speed with a small magnetic spacing, contacts with the magnetic recording medium due to a malfunction.

The lubricating layer plays a role of allowing the magnetic head to run smoothly and stably above the magnetic recording medium. A very thin lubricating layer is formed on the protective layer, and corresponds an outermost layer of the magnetic recording medium.

An element to determine the performance of the protective layer is the denseness of the protective layer. Therefore for the protective layer, a carbon layer having high denseness is normally used, and even among the carbon layers, a diamond-like carbon (DLC) layer is normally used. The DLC layer has an $sp^3$ bonding where carbon elements densely bond with one another with a strong bonding force, and is therefore ideal in terms of corrosion resistance and durability, as mentioned above.

To form a DLC layer, a plasma CVD (Chemical Vapor Deposition) method using hydrocarbon gas as a raw material is widely used. According to the plasma CVD method, a plasma state is generated by applying energy to a compound gas containing atoms constituting the film, whereby active ions and radicals are generated, and cause chemical reactions, and a thin film is formed as a result. As the thickness of the protective layer decreases, coatability is affected, hence earnest research to maintain corrosion resistance and durability by further increasing denseness are ongoing. In the case of a carbon layer, increasing the $sp^3$ bonding ratio is critical, and a method to generate high density plasma must be selected. In J. Robertson, *Diamond and Related Materials*, Vol. 3, (1994) pp. 361-368, it is stated that the $sp^3$ bonding ratio can be increased by optimizing the energy of carbon ions generated by the plasma. In other words, optimizing film deposition conditions is also important.

The plasma CVD method is classified into the following types depending on the plasma generation method and the plasma density to-be-generated. For example, the plasma density is about $10^{11}$ $cm^{-3}$ in the CCP (Capacitively Coupled Plasma) type, about $10^{10}$ $cm^{-3}$ to $10^{11}$ $cm^{-3}$ in a thermal filament type, about $10^{11}$ $cm^{-3}$ to $10^{12}$ $cm^{-3}$ the ECR (Electron Cyclotron Resonance) type or in the ICP (Inductively Coupled Plasma) type, and about $10^{12}$ $cm^{-3}$ or more in the MEICP (Magnetically Enhanced Inductively Coupled Plasma) type, where a DC magnetic field is added to the ICP method.

It is known that the DLC layer has high water repellency and has a large contact angle with respect to water (hereafter simply called "contact angle"). Water repellency becomes higher as the film has higher corrosion resistance and denser structure. Therefore by using this characteristic, a method of obtaining high corrosion resistance by specifying the protective layer using a specific contact angle was proposed. For example, see Japanese Patent Application Laid-open Nos. S61-222024, H08-167138 and H09-237415 (No. 1 to 3). Japanese Patent Application Laid-open No. S61-222024 is characterized in that the contact angle is 75° or more, and Japanese Patent Application Laid-open No. H08-167138 is characterized in that the contact angle is 60° or more. Moreover, Japanese Patent Application Laid-open No. H09-237415 is characterized in that the contact angle is 80° or more.

A molecule of a lubricant includes a main chain having a lubrication function, and a terminal group having a polarity to bond with the protective layer. If the water repellency of the protective layer is high, an interaction, such as hydrogen bonding, chemical bonding and polar interaction, between the terminal group of the lubricant and the protective layer becomes weak, and a sufficient amount of the lubricant cannot be coated under normal coating conditions. If the lubricant is insufficient when a dedicated cleaning head or cleaning tape scans the surface of the magnetic recording medium in the surface cleaning step, which is performed before testing the flyability of the magnetic head in the manufacturing steps of the magnetic recording medium, then strong friction with the protective layer is generated due to insufficient lubrication, and the surface of the magnetic recording medium is scratched and the medium becomes useless. Even if coating conditions are changed and the coating film thickness is secured in this state, the ratio of the thickness of the non-bonded lubricant with respect to the total coating film thickness increases, and therefore when the magnetic head flies and travels, the non-bonded lubricant flows into a peripheral area, due to the wind pressure that is generated during the flying of the magnetic head, which results in a drop in lubricity in an area where the magnetic head traveled, or results in an unstable flying of the magnetic head caused by the transfer of the lubricant to the magnetic head.

As a solution to this problem, a treatment to decrease the repellency of the surface of the protective layer before coating the lubricant has been proposed. For example, Japanese Patent Application Laid-open No. 2001-266328 discloses that the contact angle of the protective layer with respect to water is decreased to 10° to 30° by treating the surface of the protective layer, down to a very shallow area from the surface, using nitrogen plasma. The nitrogen plasma treatment is a method of generating plasma in a chamber where nitrogen gas is introduced, which allows active nitrogen ions and nitrogen radicals to react with the surface of the protective layer, so that the repellency of the surface is decreased by the nitrogen absorbed into the surface of the protective layer.

Patent Document 1: Japanese Patent Application Laid-open No. S61-222024
Patent Document 2: Japanese Patent Application Laid-open No. H8-167138
Patent Document 3: Japanese Patent Application Laid-open No. H9-237415
Patent Document 4: Japanese Patent Application Laid-open No. 2001-266328
Non-patent Document 1: J. Robertson, *Diamond Related Materials*, Vol. 3, (1994), pp. 361-368

At the moment, there is a demand to decrease the thickness of the protective layer to about 2.5 nm. Further, as design guidelines for hard disk drives in the future, a 1 Tb/in$^2$ recording density and 6.5 nm magnetic spacing are proposed, which means that the protective layer must be even thinner. Concerning the magnetic spacing, the thickness of the protective layer of the magnetic head is about 2 nm, the distance between the outermost surface of the magnetic head and the outermost surface of the magnetic recording medium (flying height of the magnetic head) is about 2 nm, and the thickness of the lubricating layer of the magnetic recording medium is about 0.5 nm to 1 nm, therefore it is expected that the thickness of the protective layer of the magnetic recording medium is 2 nm or less.

If such an extremely thin protective layer is required, various problems are generated which never existed before. When the protective layer is treated with nitrogen plasma, deterioration of the protective layer caused by the nitrogen plasma treatment must be minimized.

If the sp$^3$ bonding ratio of the DLC layer is increased to improve durability, water repellency increases along with the increase of the sp$^3$ bonding ratio, and bondability between the lubricant and the protective layer deteriorates.

A possible solution to this problem is to constitute the protective layer of the magnetic recording medium by two layers made of different materials. For example, the protective layer is constituted by two layers, where silicon is used for the lower layer, and DLC is used for the upper layer. However if different types of materials are bonded, the protective layer may become unstable since warping tends to occur to the protective layer because the physical properties, such as the thermal expansion coefficients, of the materials are different, and inter-facial mismatch effects are generated.

SUMMARY

With the foregoing in view, it is an object of the present invention to provide a manufacturing method for obtaining a protective layer which maintains good corrosion resistance and on which lubricant easily adheres.

The present invention is a manufacturing method for a magnetic recording medium which includes a magnetic layer, a lower protective layer, an upper protective layer and a lubricating layer on a substrate, and in which the total film thickness of the lower protective layer and the upper protective layer is 2.5 nm or less, the method sequentially including: 1) a step of depositing the lower protective layer; 2) a step of performing oxygen plasma treatment on the lower protective layer; 3) a step of depositing the upper protective layer; and 4) a step of performing nitrogen plasma treatment on the upper protective layer.

The lower protective layer and the upper protective layer are preferably formed of a carbon-based material, and it is even more preferable to be formed of a diamond-like carbon.

The contact angle of the lower protective layer with respect to water in the atmosphere is preferably 25° or less.

In the step of performing the oxygen plasma treatment, it is preferable that the thermal filament type plasma using a mixed gas of rare gas and oxygen is used.

According to the present invention, high corrosion resistance and good magnetic head flyability are implemented, and adhesiveness of the lubricant to the protective layer can be maintained even if the thickness of the protective layer is 2.5 nm or less. Furthermore, according to the present invention, a magnetic recording medium that can support high density recording, of which recording density is over 1 Tb/in$^2$, can be provided.

DETAILED DESCRIPTION

As a result of intensive studies with the foregoing in view, the present inventors obtained the following information and completed the present invention.

It was discerned that in a very thin protective layer (film thickness: 2.5 nm or less), which is the subject of the present invention, treating the surface of the protective layer not only modifies the outermost surface, but also affects the entire protective layer. As a result, in the very thin protective layer (film thickness: 2.5 nm or less), various problems occur which never existed before. When the protective layer is treated with nitrogen plasma, not only is the outermost surface of the protective layer modified, but also the surface layer portion of the protective layer, down to a certain depth, is modified, which deteriorates the protective layer. In concrete terms, if the protective layer is thin, the nitrogen plasma treatment influences the entire thickness of the protective layer, most of the protective layer is damaged by the nitrogen plasma, denseness thereof drops, and corrosion resistance worsens. If the nitrogen plasma treatment is diluted to avoid this influence, then bondability of the lubricant and the protective layer deteriorates as a result, scratches are generated, and flying of the magnetic head becomes unstable. In other words, a trade-off relationship is created. In each document of the citation list mentioned above, the thickness of the protective layer is 10 nm or more or 3 to 8 nm, and in the case of a thick protective layer, the problem of damage to the entire protective layer does not occur.

On the other hand, the inventors discovered the following phenomenon which occurs in a very thin protective layer, whereby the above mentioned problem was solved. Now the case of forming a protective layer constituted by two layers (a lower protective layer and an upper protective layer), will be described to simplify description, but the present description can also be applied to a case of a protective layer constituted by three or more layers as long as the film thickness of the protective layer is 2.5 nm or less.

The surface treatment of the upper protective layer influences the lower protective layer, but it was also discovered that the lower protective layer influences the upper protective layer. In concrete terms, in the case of the protective layer constituted by two layers, the contact angle of the protective layer, with respect to the water, changes depending on the material of the lower protective layer and the thickness of the upper protective layer. In other words, if water is dripped onto the surface of the upper protective layer and the contact angle is measured, the contact angle changes depending on the material and the surface state of the lower protective layer even if the same material is used for the upper protective layer. This means that the contact angle of the protective layer is not determined by the design of the upper protective layer alone, but design of the lower protective layer must be included as well.

As mentioned above, if the corrosion resistance of the protective layer is improved, water repellency increases, and the adhesiveness of the lubricant tends to drop. However if the above mentioned phenomenon, which is generated when the film thickness of the protective layer is very thin, is exploited, the tradeoff of the corrosion resistance and the adhesiveness of the lubricant can be solved. In other words, even if the upper protective layer is formed to be a dense layer with a high $sp^3$ bonding ratio so as to improve corrosion resistance, the contact angle of the protective layer as a whole can be decreased and the adhesiveness of the lubricant can be improved if a layer with a small contact angle is used for the lower protective layer.

It is preferable that the upper protective layer and the lower protective layer are formed of a same material. This is because if different materials are bonded, the protective layer tends to easily warp and becomes unstable, due to the difference of physical property values, such as thermal expansion coefficients and an inter-facial mismatch effect. In order to implement different contact angles using the same material, surface treatment is performed on the lower protective layer to alter the surface. Specifically, the contact angle of the lower protective layer is decreased by performing an oxygen plasma treatment.

It is preferable to use a carbon-based material for the material of the upper protective layer and the lower protective layer. In concrete terms, DLC or graphite can be used, but DLC is preferable since denseness is high and hardness is also high. For the carbon-based material, it is preferable that a material containing at least one element out of hydrogen, oxygen and nitrogen is added to the carbon.

Figure 1:
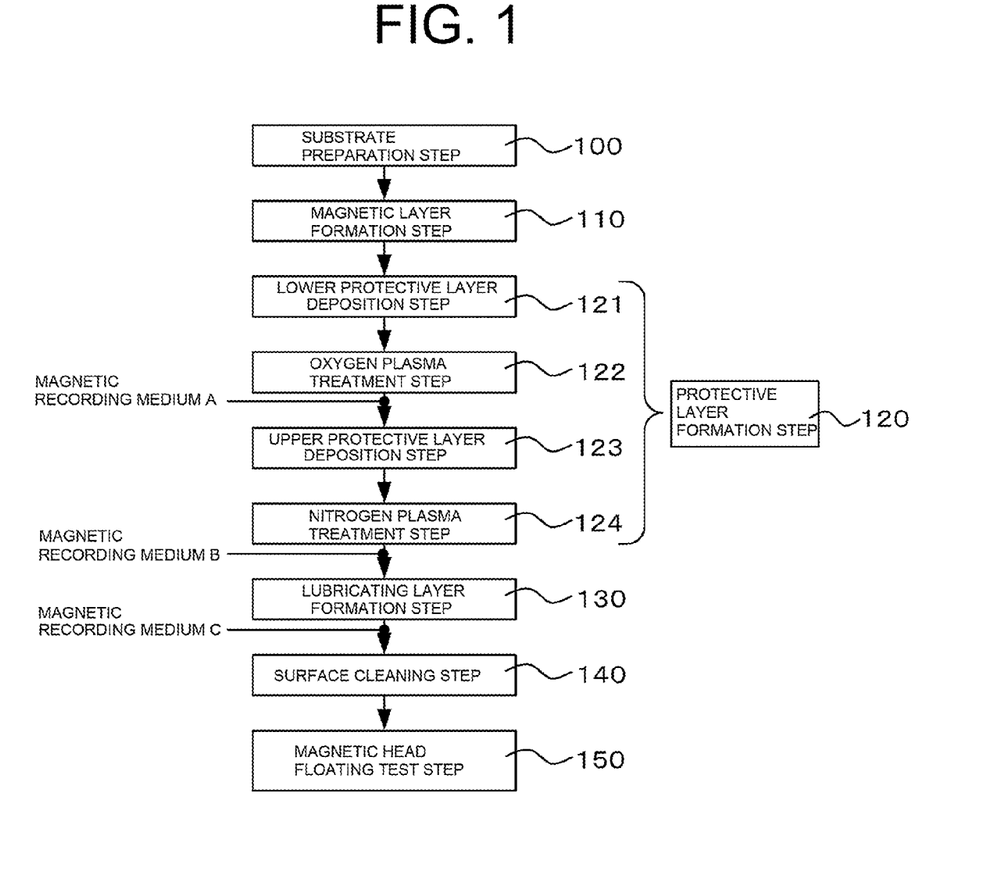
FIG. 1 is a flow chart depicting the steps of manufacturing a magnetic recording medium for describing an example of the manufacturing method of the present invention.
Figure 2:
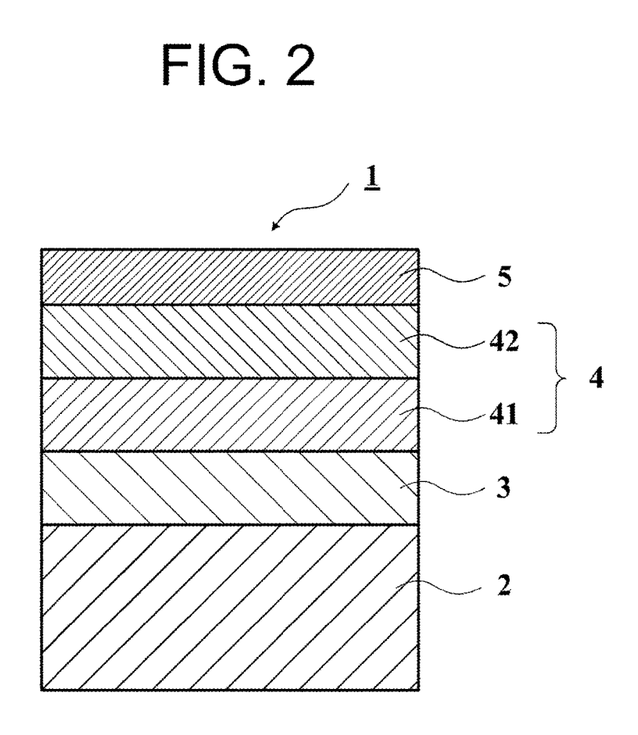
FIG. 2 is a schematic cross-sectional view depicting an example of the magnetic recording medium obtained by the present invention.

Embodiments of the present invention will now be described in concrete terms with reference to the drawings. FIG. 1 shows an example of the manufacturing steps of a magnetic recording medium used for the present invention, and FIG. 2 shows a magnetic recording medium that is manufactured. FIG. 2 shows only a cross-section of one side of the substrate, but normally each layer is formed on both sides of the substrate.

First in a substrate preparation step 100, a doughnut-shaped substrate 2, of which base material is glass, aluminum or the like, is polished flat until the roughness becomes suitable for flying the magnetic head, and then abrasives and polishing refuse are completely washed off. For example, a substrate 2 of which base material is glass is polished until the surface roughness Ra becomes about 0.1 nm in the substrate preparation step 100, then the abrasive and polishing refuse are favorably removed by, for example, ultrasonic cleaning and scrub cleaning.

Then in a magnetic layer formation step 110, a magnetic layer 3 constituted by a metal material is deposited on the substrate 2 by a sputtering method or the like in a film deposition apparatus which maintains an internal vacuum environment.

After the magnetic layer 3 is deposited, a protective layer formation step 120 is continuously executed in the film deposition apparatus which maintains an internal vacuum environment. In the protective layer formation step 120, a lower protective layer deposition step 121, an oxygen plasma treatment step 122, an upper protective layer deposition step 123 and a nitrogen plasma treatment step 124 are executed in sequence.

The lower protective layer deposition step 121 is a step of depositing the lower protective layer 41. For the film deposition method, an arc ion plating method, a plasma enhanced chemical vapor deposition (CVD) method, a sputtering method or the like can be used. To introduce hydrogen atoms into the lower protective layer 41, a plasma CVD method using hydrocarbon material, such as ethylene and acetylene, or using hydrocarbon liquid material, such as xylene, toluene and benzene, is used. Depending on usage, the plasma used for the plasma CVD method can be selected, for example, from a capacitively coupled plasma (CCP) type using a plane parallel plate, an inductively coupled plasma (ICP) type, a thermal filament type, an electron cyclotron resonance (ECR) type and an electron cyclotron wave resonance (ECWR) type. In the plasma CVD method where a source gas containing hydrogen is used, a number of hydrogen atoms are introduced into the lower protective layer 41. The lower the concentration of hydrogen atoms in the lower protective layer 41 the better in terms of obtaining a dense film with high $sp^3$ bondability. To decrease the concentration of hydrogen atoms in the lower protective layer 41, an arc ion plating method, in particular a filtered cathodic arc (FCA) method can be used to deposit the film.

When the lower protective layer 41 is being deposited, it is preferable to apply bias to the substrate 2. The thickness of the layer can be controlled by the film deposition time.

The surface roughness (Ra) of the lower protective layer 41 is preferably 0.5 nm or less. For the magnetic recording medium having an upper protective layer 42 of which thickness is 2.5 nm, to have a corrosion resistance required for practical use, the upper protective layer must be formed dense. By forming a smooth lower protective layer 41 (underlayer), a dense upper protective layer 42 can be formed. The roughness of the lower protective layer 41 can be controlled by the power and the gas flow rate during the film deposition. The surface roughness of the lower protective layer 41 can be controlled either by increasing the power and increasing the gas flow rate during the film deposition, or by decreasing the power and decreasing the gas flow rate during the film deposition.

An oxygen plasma treatment step 122 that is executed next is a step of modifying the surface of the lower protective layer 41 by exposing the surface to oxygen plasma. By the oxygen plasma treatment, the contact angle of the lower protective layer 41, with respect to water, is decreased. The contact angle of the lower protective layer 41 is preferably 40° or less, and is particularly preferably 25° or less. The oxygen plasma treatment step 122 may be executed using the same film deposition chamber in which the lower protective layer deposition step 121 was executed, or by using a different apparatus. In terms of cost, it is preferable to use the film deposition chamber used in the lower protective layer deposition step 121. Oxygen gas is introduced into the film deposition chamber and the surface of the lower protective layer 41 is treated by the generated plasma. Oxygen gas alone may be introduced, but it is preferable to introduce the oxygen gas mixed with rare gas, such as argon. The amount of oxygen that is introduced into the surface of the lower protective layer 41 can be controlled by adjusting the exposure time of the oxygen plasma. The amount of oxygen can be measured by using XPS analysis, for example. The preferable oxygen content is 5 to 35 atomic %. If the oxygen content is less than 5 atomic %, it is difficult to make the contact angle of the lower protective layer 41, with respect to water, to be 40° or less, and if 35 atomic % is exceeded, the lower protective layer 41 deteriorates due to excessive oxidation.

The magnetic recording medium in the stage after the oxygen plasma treatment step 122 completes is hereafter called "magnetic recording medium A".

Then an upper protective layer deposition step 123 is executed to deposit the upper protective layer 42. For the film deposition method, the same method used for the lower protective layer deposition step 121 can be used.

A nitrogen plasma treatment step 124 that is executed next is a step of modifying the surface of the upper protective layer 42 by exposing the surface to the nitrogen plasma. The nitrogen plasma treatment step 124 may be executed by using the same film deposition chamber in which the upper protective layer deposition step 123 was executed, or by using a different apparatus. In terms of cost, it is preferable to use the film deposition chamber that was used in the upper protective layer deposition step 123. The nitrogen gas is introduced into the film deposition chamber, and the surface of the upper protective layer 42 is treated by the generated-plasma. The amount of nitrogen that is introduced into the surface of the upper protective layer 42 can be controlled by adjusting the exposure time to the nitrogen plasma. The amount of nitrogen can be measured by XPS analysis or the like. The preferable nitrogen content in the outermost surface of the upper protective layer 42 is 5 atomic % or more, and less than 14 atomic %. If the nitrogen content is less than 5 atomic %, the adhesiveness of the lubricant is insufficient, and a desired lubricating layer 5 cannot be easily obtained. If the nitrogen content in the outermost surface of the upper protective layer 42 in the nitrogen plasma treatment is 14 atomic % or more, the influence of the nitrogen plasma treatment reaches throughout the entire thickness of the protective layer 4, which is the protective layer 4 having a thin film thickness according to this proposal, and most of the protective layer 4 is damaged by the nitrogen plasma, density drops, and corrosion resistance deteriorates.

The outermost surface of the upper protective layer 42 is in a range that is set considering a resolution that is measurable in the XPS analysis or the like, and specifically in a range down to a 1 nm depth from the surface of the upper protective layer 42.

The magnetic recording medium in a stage where the steps until the nitrogen plasma treatment step 124 has completed is hereafter called "magnetic recording medium B".

Then in the lubricating layer formation step 130, liquid lubricant is coated on the upper protective layer 42 by a dipping method (dip coating method) so as to form the lubricating layer 5. For the liquid lubricant, perfluoropolyether (PFPE), for example, can be used. After the coating, it is preferable to perform a heating treatment by leaving the magnetic recording medium in a heating furnace for a predetermined time. By the heating treatment, the bonding strength between the lubricating layer 5 and the protective layer 4 is increased, and easy peeling of the lubricating layer 5 can be prevented.

The magnetic recording medium in a manufacturing stage where the lubricating layer formation step has completed is hereafter called "magnetic recording medium C".

Then the surface cleaning step 140 is executed as an option, so as to remove the protrusions and adhering dirt that could interfere with the flying of the magnetic head. For the surface cleaning step 140, a conventional method used in this technical field can be used. For example, a tape burnishing method or a buff method can be used. It is preferable that scratches on the surface of the magnetic recording medium, that may have occurred during the surface cleaning step 140, are inspected by measuring the surface of the magnetic recording medium C using an appearance inspection apparatus after the tape burnishing or the like.

Then a glide test is performed as an option in the magnetic head flying test step 150. In the glide test, a glide head, on which a piezoelectric sensor or the like is installed, is flown with maintaining a predetermined flying height from the surface of the magnetic recording medium. If the height of a protrusion that exists on the surface of the magnetic recording medium is higher than the flying height of the glide head, the glide head collides with the protrusion, and the piezoelectric sensor detects this collision. If a collision greater than a predetermined value is detected at least at one location on the surface of the magnetic recording medium, then this magnetic recording medium is regarded as defective.

Configuration of Each Layer

A configuration of the magnetic recording medium, other than the protective layer, will now be described in concrete terms.

For the substrate 2, an NiP-plated Al alloy substrate, which is used for a standard magnetic recording medium, or a glass substrate of tempered glass or crystallized glass can be used. If the substrate heating temperature is controlled at 100° C. or less, a plastic substrate made of resin, such as polycarbonate or polyolefin, may be used.

Another material which has rigidity and flatness may also be used, such as a silicon single-crystal substrate, or a silicon single-crystal substrate of which surface is treated with thermal oxidation.

The magnetic layer 3 is a layer used for magnetic recording, and a magnetic layer normally used in this technical field can be used. It is preferable that the magnetic layer has a multilayer configuration constituted by a soft magnetic underlayer, seed layer, intermediate layer and magnetic recording layer or the like, each of which has a different function.

It is preferable to form the soft magnetic underlayer in order to improve the read-write characteristic by controlling the magnetic flux from the magnetic head used for magnetic recording, but the soft magnetic underlayer may be omitted. For the soft magnetic underlayer, a crystalline NiFe alloy, a sendust (FeSiAl) alloy, or a CoFe alloy, or a microcrystalline FeTaC, CoTaZr, CoFeNi, CoNiP or the like can be used, but a better electromagnetic conversion characteristic can be obtained if an amorphous Co alloy, such as CoNbZr or CoTaZr is used. The optimum film thickness value of the soft magnetic underlayer changes depending on the structure and characteristic of the magnetic head used for magnetic recording, but preferably is 10 nm to 500 nm, in terms of productivity, if the soft magnetic underlayer is continuously deposited together with other layers. If the soft magnetic underlayer is deposited on a non-magnetic substrate in advance by a plating method or the like before depositing the other layers, the film thickness may be thicker, such as several µm.

A magnetic domain control layer may be formed in order to control the magnetic domain of the soft magnetic underlayer, and to suppress noise, such as the spike noise generated due to the soft magnetic underlayer.

It is preferable to form the seed layer immediately under the intermediate layer in order to improve the orientation of the intermediate layer, but the seed layer may be omitted. For the seed layer, a non-magnetic material or a soft magnetic material can be used. If the soft magnetic underlayer is formed under the seed layer, it is preferable to use a soft magnetic material for the seed layer since the seed layer can function as a part of the soft magnetic underlayer.

For the material of the seed layer that has the soft magnetic characteristic, an Ni-based alloy such as NiFe, NiFeNb, NiFeB and NiFeCr, Co, or a Co-based alloy, such as CoB, CoSi, CoNi and CoFe can be used.

The intermediate layer is a layer formed for appropriately controlling the crystal orientation, crystal grain size and grain boundary segmentation of the magnetic recording layer. For the intermediate layer, a metal having a hexagonal close-packed structure or an alloy material thereof, or a metal having a face-centered cubic lattice structure or an alloy material thereof is preferably used.

Particularly in terms of crystal orientation control for the magnetic recording layer, any metal out of Ti, Re, Ru, Os, Zr, Zn and Tc having a hexagonal close-packed crystal structure (hcp), or an alloy containing at least one of metal out of Ti, Re, Ru, Os, Zr, Zn and Tc is preferable. For the metal having a face-centered cubic lattice structure, any one of Cu, Rh, Pd, Ag, Ir, Pt, Au, Ni and Co, or an alloy containing at least one of metal out of Cu, Rh, Pd, Ag, Ir, Pt, Au, Ni and Co is preferable.

The magnetic recording layer is a layer for recording data by a magnetic field applied by the magnetic head. The magnetic recording layer is not limited to a single layer, but may have a multilayer configuration. It is preferable to have a granular structure where the non-magnetic crystal grain boundary, of which main component is an oxide and/or a nitride, surrounds the ferromagnetic crystal grain.

For the ferromagnetic crystal grain, a material which has Co as a main component and contains at least Pt and Cr is preferably used. To control the grain size and improve crystallinity, it is preferable to add at least one element out of Ni, Ta, B, Nb, Ag, Mo, W, Pd and Cu to the ferromagnetic crystal grain. For the material constituting the non-magnetic crystal grain boundary, it is preferable to use an oxide and/or a nitride of at least one element out of Cr, Co, Al, Ti, Si, Ta, Hf, Zr, Y and Ce, in terms of forming a stable granular structure.

For the ferromagnetic crystal grain, an ordered alloy of which main material is FePt, FePd, CoPt, FeNi or the like can also be used.

The thickness of the magnetic recording layer is preferably 5 to 50 nm.

The lubricating layer 5 is a layer for ensuring a good sliding characteristic of the magnetic head. For the lubricating layer 5, a liquid lubricant, solid lubricant or the like can be used. An example of the liquid lubricant is a fluorine-based liquid lubricant, such as perfluoropolyether. This includes, for example, a lubricant normally used for magnetic recording media, such as Fomblin-Z-DOL, AM3001 and Z-Tetraol manufactured by Solvay. Any solvent can be used to dilute this liquid lubricant as long as it is compatible with the lubricant and can form a uniform solution. For example, a fluorocarbon-based organic solvent, such as HFE7200 (Sumitomo 3M Ltd.) and Vertrel (DuPont) can be used. The dilution ratio of the lubricant is set in advance according to the film quality and surface roughness $R_{max}$ of the protective layer, and is usually set to a 0.01 wt % to 5 wt % range. If the concentration of the solution exceeds 5 wt %, dissolution of the lubricant becomes insufficient, and insoluble components are aggregated, which makes the coated-film thickness unstable. If the concentration of the solution is less than 0.01 wt %, then it becomes difficult to form the required film having a 1 to 2 nm thickness.

The liquid lubricant has a polar group, such as a hydroxyl group or a piperonyl group, at the end of the chain molecule structure, which remains on the protective layer due to the polar group bonding with the binding sites that exist on the surface of the protective layer 4. Example of the binding sites on the surface of the protective layer are a carboxyl group, carbonyl group, hydroxyl group, ether and dangling bonds. When these binding sites and terminal polar groups of the lubricant are bonded, the bonding energy differs depending on the type of the binding site, resulting in strong or weak bonding, therefore controlling the surface state of the protective layer 4 is critical.

Evaluation Method

An evaluation method used for the characteristic evaluation will now be described.

The contact angle with respect to water was measured based on a drop method in use of a contact angle gauge. In concrete terms, a water droplet is dropped onto the surface of a horizontally positioned magnetic recording medium, the water droplet on the surface is observed from the side using a microscope, the angle formed by a line connecting the edge of the water droplet and the vertex and the surface of the magnetic recording medium is doubled, and this angle is regarded as the contact angle. In the case of measuring the contact angle of the lower protective layer 41, a magnetic recording medium A was sampled out in the middle of the manufacturing steps, and the measurement was performed using the magnetic recording medium A.

The nitrogen content and the oxygen content in the protective layer were measured using XPS analysis. The measurement area is the midst of the inner and outer periphery of the magnetic recording medium, where measurement was performed at four points at every 90° angle in the circumferential direction, and the average of the measured values was determined as the nitrogen content or the oxygen content value.

To evaluate the corrosion resistance of the magnetic recording medium, the Co elution amount was measured. In concrete terms, acid was dripped onto the surface of the magnetic recording medium B where the protective layer 4 has been formed, whereby the corrosion resistance of the protective layer 4 was evaluated. If a Co-based alloy is used for the magnetic layer 3 of the magnetic recording medium B, the amount of Co that eluded into the acid from the protective layer 4 is evaluated, whereby the corrosion resistance of the protective layer 4 is determined. As a procedure, a predetermined amount of acid is dripped onto the horizontally positioned magnetic recording medium B, and is left for a predetermined time, then all the liquid is collected.

Then the amount of Co contained in the liquid is measured by ICP-MS (Inductively Coupled Plasma Mass Spectrometry). This value is divided by an area on the surface of the magnetic recording medium B where the dripped-liquid contacted, so as to obtain the elution amount of the Co per unit area. In concrete terms, the acid used for the corrosion resistance evaluation was nitric acid that has a 3% volume concentration, the dripped amount was 0.8 ml, and the length of time of leaving the same after the initial dripping was one hour. The evaluation criterion of the corrosion resistance in this test method is that the elution amount of Co in a unit area is 7 $ng/cm^2$ or less, which is an experience-based value that guarantees the reliability when the magnetic recording medium is mounted on a hard disk drive. It is more preferable that the elution amount of Co is 5 $ng/cm^2$ or less.

The thickness of the lubricating layer 5 was measured using Fourier Transform Infrared Spectroscopy (FT-IR). First the magnetic recording medium B, which has no lubricating layer, was measured in advance, then the magnetic recording medium C, which has a lubricating layer, is measured so that the thickness of the lubricating layer 5 was determined by determining the difference of these values.

The glide test was performed using a glide head on which a piezoelectric sensor is installed. The glide head was flown with maintaining a predetermined flying height from the surface of the magnetic recording medium. If the height of a protrusion that exists on the surface of the magnetic recording medium is higher than the flying height, the glide head collides with the protrusion, and the piezoelectric sensor detects this collision. If a collision greater than a predetermined value is detected at least in one location on the surface of the magnetic recording medium, then this magnetic recording medium was regarded as defective. In concrete terms, a glide head having a 30% slider was flown at a 8.6 m/sec. linear velocity, so that the entire surface is scanned thereby. The evaluation criterion in the glide test is that if the voltage value transmitted by the piezoelectric sensor is a predetermined value or less throughout the entire surface of the scanning range, the magnetic recording medium passes the test.

EXAMPLES

Example 1

First in the substrate preparation step 100, a glass substrate 2, of which nominal diameter is 2.5 inches, was polished until the surface roughness Ra becomes 0.1 nm, and abrasives and polishing refuse were completely removed using ultrasonic cleaning and scrub cleaning.

Then in the magnetic layer formation step 110, a magnetic layer 3 was formed on the substrate 2 in the film deposition apparatus which maintains an internal vacuum environment, using a sputtering method. The soft magnetic underlayer was formed to be a 60 nm film thickness first. Then a seed layer and an intermediate layer were formed, and finally a granular type magnetic recording layer made of CoCrPt—$SiO_2$ was formed to be a 20 nm film thickness.

After depositing the magnetic layer 3, the lower protective layer deposition step 121 was executed in the deposition apparatus which similarly maintains an internal vacuum environment, and the lower protective layer 41 was deposited. Using the thermal filament type plasma CVD method, a DLC film was deposited under the conditions that the source gas is $C_2H_4$, the gas flow rate is 30 sccm, and the bias voltage between the filament and the substrate is 100V. If the oxygen plasma treatment step 122 is executed, the DLC film thickness becomes somewhat thinner, so the film thickness after film deposition in the lower protective layer deposition step 121 was adjusted so that the film thickness after the oxygen plasma treatment step becomes 0.7 nm.

Then in the film deposition apparatus which similarly maintains an internal vacuum environment, the oxygen plasma treatment step 122 was executed. For the treatment gas, a mixed gas of oxygen and argon, of which ratio was 1:1000, is used, and the flow rate (converted into the flow rate of the oxygen gas) was 5 sccm. To generate plasma, the thermal filament type was used. By changing the plasma generation time, the degree of oxidation of the lower protective layer 41 was controlled, and the contact angle of the lower protective layer 41 was set to 9°. The oxygen content was determined by XPS analysis. The magnetic recording medium that was completed treatment thus far is the magnetic recording medium A.

Then the upper protective layer deposition step 123 was executed in the film deposition apparatus which similarly maintains an internal vacuum environment, whereby the upper protective layer 42 was deposited. Using the thermal filament type plasma CVD method, a DLC film was deposited under the conditions that the source gas is $C_2H_4$, the gas flow rate is 30 sccm, and the bias voltage between the filament and the substrate is 100V. The films were deposited in each film thickness by adjusting the film deposition time. The film deposition conditions of the upper protective layer 42 are the same as those of the lower protective layer 41 except for the film deposition time. The plasma density generated under these conditions was measured, and the result is about $6 \times 10^{10}$ $cm^{-3}$.

Then the nitrogen plasma treatment step 124 was executed. The nitrogen plasma treatment time to deposit the 1.0 nm thick lubricating layer 5 was determined in advance for each sample, and each sample was treated with nitrogen plasma using this treatment time. The nitrogen content was determined by XPS analysis. The magnetic recording medium in this manufacturing stage is the magnetic recording medium B.

Then the lubricating layer formation step 130 was executed. Liquid lubricant Fomblin Z-Tetraol (made by Solvay Solexis) was formed to be a 1.0 nm thickness on the upper protective layer 42. The film was formed using a dip coating method, at a 2 mm/sec. speed to pull up the magnetic recording medium. Then the magnetic recording medium was left in the furnace which is maintained at about 100° C. The magnetic recording medium in this manufacturing stage is the magnetic recording medium C.

Then the surface cleaning step 140 was performed. The entire surface of the magnetic recording medium C was scanned by a burnishing tape having abrasive grains with a grain size of #6000, so as to remove protrusions and adhering dirt on the magnetic recording medium C.

Then using an appearance inspection apparatus, the presence of scratches on the surface of the magnetic recording medium was evaluated in the surface cleaning step 140.

Finally the magnetic head flying test step 150 was executed. A glide head having a 30% slider was flown at an 8.6 m/sec. linear velocity, so that the entire surface is scanned thereby. The evaluation criterion in the glide test is that if the voltage value transmitted by the piezoelectric sensor is 200 mV or less throughout the entire surface of the scanning range, the magnetic recording medium passes the test.

To evaluate each characteristic, a magnetic recording medium was sampled out in the middle of each manufacturing step, and the measurement was performed. The magnetic recording medium A was removed from the film deposition apparatus into the atmosphere, and the contact angle of the lower protective layer 41 with respect to water was measured. Further, the magnetic recording medium B was removed from the film deposition apparatus into the atmosphere, and nitrogen content in the protective layer 4 and corrosion resistance were evaluated.

Examples 2 to 6

Magnetic recording media of Examples 2 to 6 were formed under the same conditions as Example 1, except that the oxygen plasma treatment time in the oxygen plasma treatment step 122 and the nitrogen plasma treatment time in the nitrogen plasma treatment step 124 are changed. For each example, the film thickness of the lubricating layer was adjusted to 1.0 nm, while controlling the adhesiveness of the lubricant to the protective layer by adjusting the nitrogen plasma treatment time.

Table 1 shows each film deposition condition and evaluation result of Examples 1 to 6. In the evaluation result, ○ indicates good, Δ indicates acceptable, and X indicates unacceptable. The oxygen contents of Examples 1 to 6 determined by XPS analysis were 5 to 35 atomic %.

Comparative Example 1

A magnetic recording medium was fabricated in the same manner as Example 1, except that the lower protective layer 41 is not deposited, the oxygen plasma treatment step 122 is not executed, and the thickness of the upper protective layer 42 alone is 2.5 nm. Table 1 shows the result. To make the film thickness of the lubricating layer 1.0 nm, the treatment time of the nitrogen plasma treatment step 124 was adjusted. The only differences from Example 1 are that the protective layer was deposited by one step, and the oxygen plasma treatment step 122 was not executed.

Reference Examples 1 to 3

These are examples when the film thickness of the protective layer 4 exceeds 2.5 nm.

The magnetic recording media were formed under the same conditions as Example 4, except that the total film thickness of the protective layer 4 was changed by changing the film thickness of the upper protective layer 42, and the nitrogen plasma treatment time was adjusted in the nitrogen plasma treatment step 124.

To match the film thickness of the lubricating layer 5 to 1.0 nm, the nitrogen plasma treatment time was adjusted. Table 1 shows the result.

Evaluation

As comparison of Examples 1 to 6 shows, the treatment time required for the upper protective layer 42 in the nitrogen plasma treatment step 124 decreases as the contact angle of the lower protective layer 41, with respect to water, decreases, due to the execution of the oxygen plasma treatment step 122. In other words, by decreasing the nitrogen plasma treatment time and decreasing the nitrogen content in the surface of the upper protective layer 42, the adhesiveness of the lubricant can be maintained to a desired level, and a necessary film thickness can be maintained for the lubricating layer. As a result, deterioration in the corrosion resistance of the protective layer 4, caused by the nitrogen plasma treatment, can be suppressed.

This finding becomes even more clear by comparing Example 1 and Comparative Example 1. In Example 1, the contact angle of the lower protective layer 41 was decreased by the oxygen plasma treatment, so that water repellency of the protective layer 4 as a whole is suppressed, whereby adhesiveness of the lubricant to the protective layer is improved. Comparative Example 1, on the other hand, has a protective layer constituted by a single layer, that is, the lower protective layer does not exist, and the oxygen plasma treatment step 122 is not executed. This means that the adhesiveness of the protective layer 4 to the lubricant is secured by the nitrogen plasma treatment step 124, which requires a strong nitrogen plasma treatment, and increases the nitrogen in the surface of the upper protective layer 42. The strong nitrogen plasma treatment promotes deterioration in the protective layer 4, and drops corrosion resistance, and as a result, the Co elution amount obviously increases.

This result represents a phenomenon that is generated when the protective layer 4 is thin. If the film thickness of the protective layer 4 is thick, the influence of the nitrogen plasma treatment step 124 does not reach the entire protective layer, and deterioration of the protective layer 4 as a whole is suppressed. Reference Examples 1 to 3 indicate this phenomenon, where the film thickness of the protective layer 4 is 3 to 5 nm. Compared with Examples 4 to 6 where similar nitrogen plasma treatment was performed, the Co elution amount is much lower, and corrosion resistance is maintained.

TABLE 1

| | Film deposition conditions | | | | | | Evaluation result | | | |
|---|---|---|---|---|---|---|---|---|---|---|
| | Protective layer thickness (nm) | | | Nitrogen plasma treatment time (sec.) | Nitrogen content (atomic %) | Contact angle of lower protective layer (°) | Film thickness of lubricating layer (nm) | Co elution amount (ng/cm$^2$) | Surface cleaning scratches | Glide test | Total evaluation |
| | Total | Lower protective layer | Upper protective layer | | | | | | | | |
| Example 1 | 2.5 | 0.7 | 1.8 | 0.5 | 5 | 9 | 1.0 | 1.8 | ○ | ○ | ○ |
| Example 2 | 2.5 | 0.7 | 1.8 | 0.6 | 5 | 15 | 1.0 | 1.6 | ○ | ○ | ○ |
| Example 3 | 2.5 | 0.7 | 1.8 | 0.6 | 7 | 25 | 1.0 | 1.3 | ○ | ○ | ○ |
| Example 4 | 2.5 | 0.7 | 1.8 | 1.3 | 14 | 27 | 1.0 | 5.5 | ○ | ○ | Δ |
| Example 5 | 2.5 | 0.7 | 1.8 | 1.3 | 16 | 33 | 1.0 | 6.0 | ○ | ○ | Δ |
| Example 6 | 2.5 | 0.7 | 1.8 | 1.6 | 17 | 40 | 1.0 | 6.3 | ○ | ○ | Δ |
| Comparative example 1 | 2.5 | — | 2.5 | 1.5 | 19 | — | 1.0 | 7.4 | ○ | ○ | x |
| Reference example 1 | 3.0 | 0.7 | 2.3 | 1.4 | 12 | 27 | 1.0 | 1.5 | ○ | ○ | ○ |
| Reference example 2 | 4.0 | 0.7 | 3.3 | 1.6 | 13 | 27 | 1.0 | 0.9 | ○ | ○ | ○ |
| Reference example 3 | 5.0 | 0.7 | 4.3 | 1.9 | 16 | 27 | 1.0 | 0.5 | ○ | ○ | ○ |

Noteworthy here is the relationship between the contact angle of the lower protective layer 41 with respect to water and the Co elution amount. A clear change is observed in the Co elution amount when the contact angle is 25°, and the Co elution amount drops considerably when the contact angle is 25° or less. At the moment, the reason why the sudden change is exhibited at contact angle 25° has not yet been identified.

EXPLANATION OF REFERENCE NUMERALS

100 substrate preparation step
110 magnetic layer formation step
120 protective layer formation step
121 lower protective layer deposition step
122 oxygen plasma treatment step
123 upper protective layer deposition step
124 nitrogen plasma treatment step
130 lubricating layer formation step
140 surface cleaning step
150 magnetic head flying test step
1 magnetic recording medium
2 substrate
3 magnetic layer
4 protective layer
41 lower protective layer
42 upper protective layer
5 lubricating layer

What is claimed is:

1. A manufacturing method for a magnetic recording medium which includes a magnetic layer, a lower protective layer, an upper protective layer and a lubricating layer on a substrate, and in which the total film thickness of the lower protective layer and the upper protective layer is 2.5 nm or less, and the lower protective layer and the upper protective layer are formed of a carbon-based material,
   the method sequentially comprising:
   1) a step of depositing the lower protective layer;
   2) a step of performing oxygen plasma treatment on the lower protective layer;
   3) a step of depositing the upper protective layer; and
   4) a step of performing nitrogen plasma treatment on the upper protective layer;
   wherein in the step of performing oxygen plasma treatment on the lower protective layer, the oxygen plasma treatment is applied to a surface of the lower protective layer after formation of the lower protective layer of the carbon-based material is complete, and
   the oxygen plasma treatment uses only oxygen gas or a mixed gas of oxygen gas and a rare gas.

2. The manufacturing method for a magnetic recording medium according to claim 1, wherein the lower protective layer and the upper protective layer are formed of diamond-like carbon.

3. The manufacturing method for a magnetic recording medium according to claim 1, wherein a contact angle of the lower protective layer with respect to water in atmospheric air, in a stage after the oxygen plasma treatment is applied to the surface of the lower protective layer, is 25° or less.

4. The manufacturing method for a magnetic recording medium according to claim 1, wherein in the step of performing the oxygen plasma treatment, a thermal filament plasma is used.

5. The manufacturing method for a magnetic recording medium according to claim 2, wherein a contact angle of the lower protective layer with respect to water in atmospheric air, in a stage after the oxygen plasma treatment is applied to the surface of the lower protective layer, is 25° or less.

* * * * *